United States Patent [19]

Soclof

[11] Patent Number: 5,031,014
[45] Date of Patent: Jul. 9, 1991

[54] LATERAL TRANSISTOR SEPARATED FROM SUBSTRATE BY INTERSECTING SLOTS FILLED WITH SUBSTRATE OXIDE FOR MINIMAL INTERFERENCE THEREFROM

[75] Inventor: Sidney I. Soclof, San Gariel, Calif.

[73] Assignee: Rockwell International Corporation, El Segundo, Calif.

[21] Appl. No.: 62,007

[22] Filed: Jun. 12, 1987

Related U.S. Application Data

[63] Continuation-in-part of Ser. No. 239,750, Mar. 2, 1981, abandoned.

[51] Int. Cl.[5] .................... H01L 29/72; H01L 23/48
[52] U.S. Cl. ......................................... 357/35; 357/65
[58] Field of Search ........................... 357/23.5, 35, 65

[56] References Cited

U.S. PATENT DOCUMENTS 4,579,849  5/1985  Korsh et al. .
4,641,170  2/1987  Ogura et al. .

OTHER PUBLICATIONS

S. Konaka et al., "A 30-ps Si Bipolar IC Using Super Self-Aligned Process Technology", *IEEE Transactions on Electron Devices*, vol. ED-33, No. 4 (Apr. 1986), pp. 526-531.
S. A. Evans et al., "A 1-Micron Bipolar VLSI Technology", *IEEE Transactions on Electron Devices*, vol. ED-27 (Aug. 1980), pp. 1373-1379.

*Primary Examiner*—J. Carroll
*Attorney, Agent, or Firm*—H. Fredrick Hamann; George A. Montanye; Wilfred G. Caldwell

[57] ABSTRACT

The invention is a transistor or array thereof and method for producing same in VLSI dimensions on a silicon substrate doped P or N type by forming intersecting slots in spaced apart relation across the substrate to define semi-arrays of V shaped intermediate regions which will become transistors. Silicon oxide fills these slots and separates the transistor regions from the substrate. Orthogonal slots divided the semi-arrays into individual transistor active regions which are doped by one of N or P doping introduced into each active regions via the orthogonal slots and driven in to comprise the emitter and collector regions on respective sides of original substrate comprising the base regions. Metallization patterns complete electrical connections to the emitter base and collector regions and silicon oxide substantially covers the periphery of each active region for total isolation. Each transistor may further comprise a doped region called P or N doping extending into and across the top of the base region underneath the interconnect metallization to reduce space region contact resistance and to provide an electron reflecting potential barrier. Each transistor may further comprise a doped skin of either P or N doping to force electrons toward the center of the base region.

9 Claims, 11 Drawing Sheets

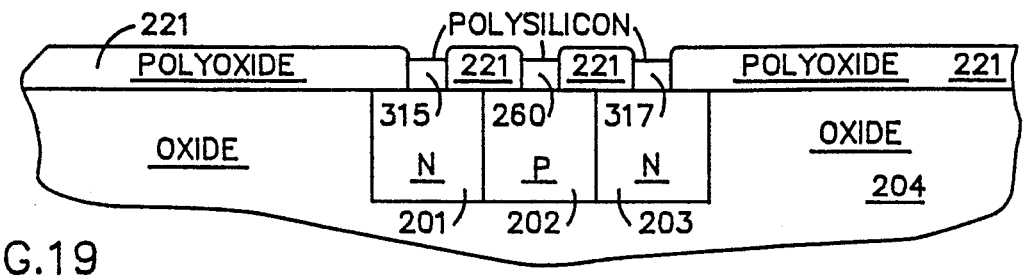
FIG.19
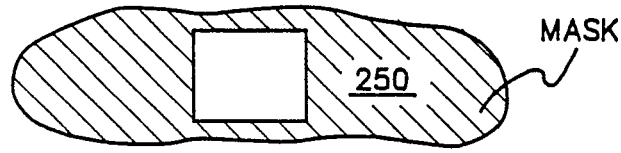
FIG.20
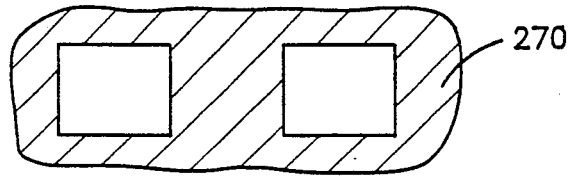
FIG.21
FIG.22
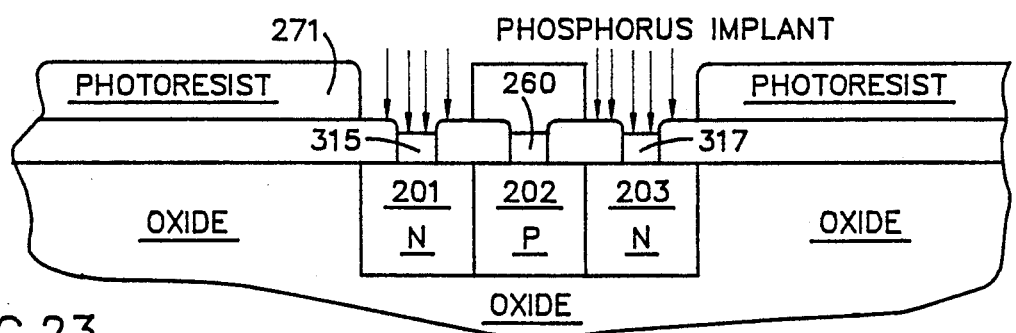
FIG.23
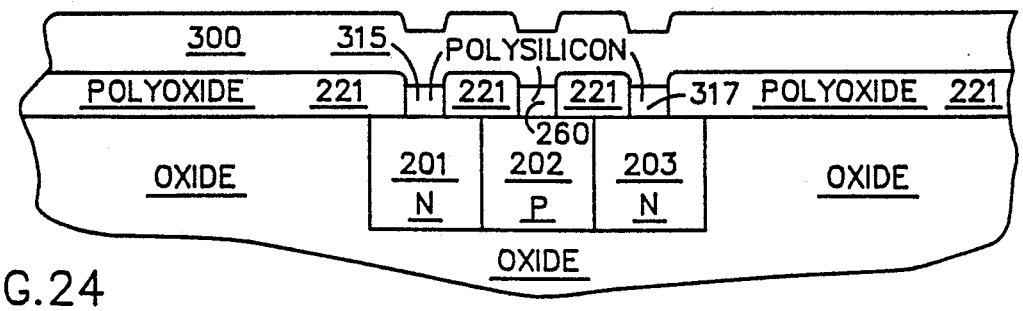
FIG.24

5,031,014

LATERAL TRANSISTOR SEPARATED FROM SUBSTRATE BY INTERSECTING SLOTS FILLED WITH SUBSTRATE OXIDE FOR MINIMAL INTERFERENCE THEREFROM

CROSS REFERENCE

This application is a continuation-in-part of Ser. No. 06/239,750 filed Mar. 2, 1981 by the same inventor.

FIELD OF THE INVENTION

This invention is a novel structure and method for forming a sub-micron type lateral oielectrically isolated transistor utilizing VLSI chip processing steps to fabricate hundreds of such devices, simultaneously.

BACKGROUND OF THE INVENTION

Techniques extracted from the prior art come from the field of sub-micron fabrication technology wherein the dimensional resolution is now comparable to or even smaller than the thicknesses of the thermally grown silicon oxide layers on silicon. Also, the dimensions are now comparable or even smaller than the base widths used for fused transistors, i.e., 0.4 to 1.0 micrometers. From these techniques, the novel structure and method for the lateral transistors with greatly reduced parasitic capacitance and resistances are achieved.

SUMMARY OF THE INVENTION

The invention is a novel lateral NPN or PNP type transistor formed on a substrate by intersecting slots and orthogonal slots for defining each active region undercut by the intersecting slots and filled with substrate oxide to isolate the effective regions from the substrate prior to oxidation filling the orthogonal slots, doping is introduced from the opposed surfaces of each individual active region to complete the NPN formation or a P doped substrate or the PNP formation or a N doped substrate. Electrical connections are made in conventional fashion to be emitter, base and collector regions.

A further feature provides a doped region extending into and across the top of the base region underneath the metallization to reduce the base region contact resistance and provide an electron deflecting potential barrier. Further, each transistor may be lightly doped about its periphery such that the doped skin forces electrons towards the center of the base region.

The following method of making extremely small contacts is an alternative method. It is applied to an NPN lateral bipolar transistor for illustrating versatility, but the principles apply equally to PNP, as outlined infra.

Figure 8:
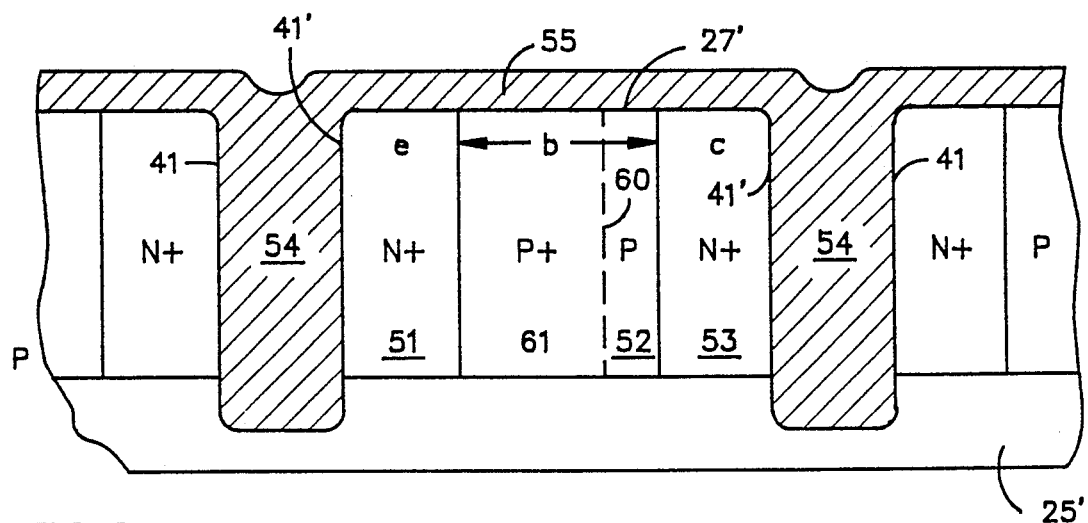
FIG. 8 is a view of single active transistor region following N+doping via the orthogonal slots and prior to oxidation filling the same.
Figure 13:
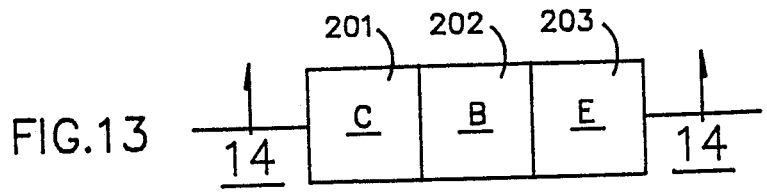
Figure 14:
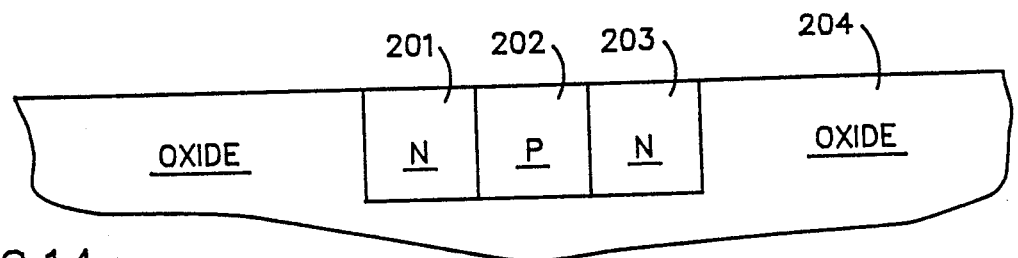
Figure 15:
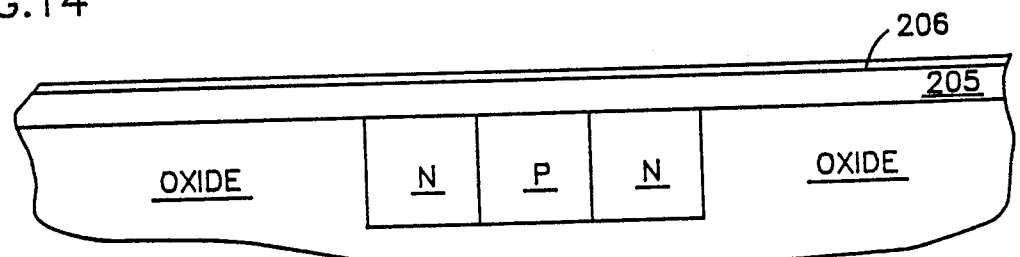
Figure 16:
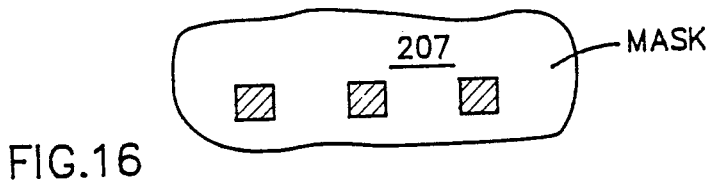
Figure 17:
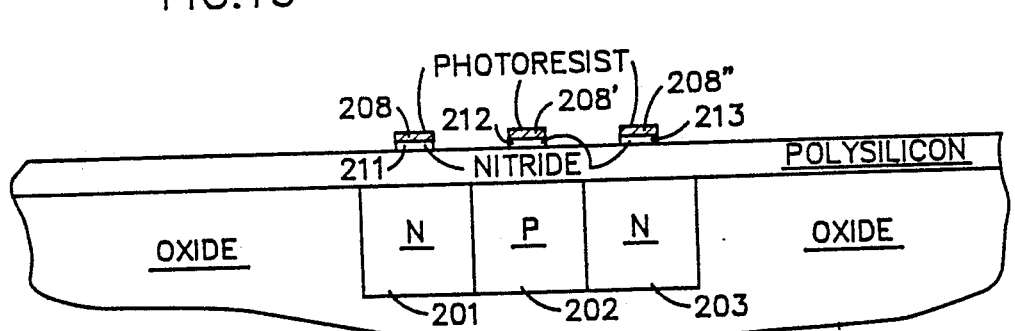
Figure 18:
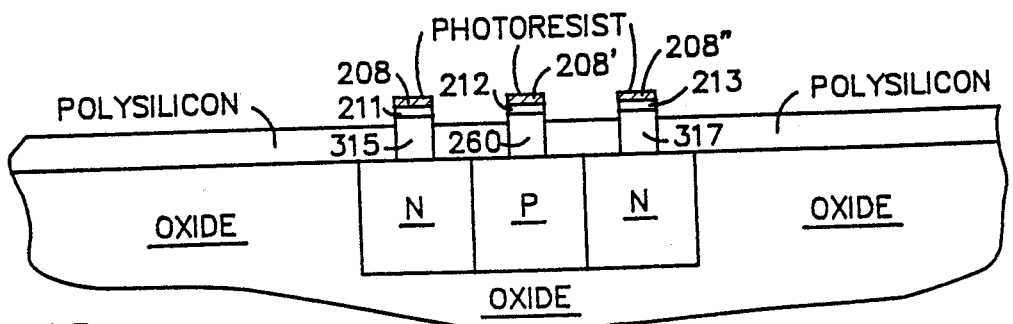
Figure 25:
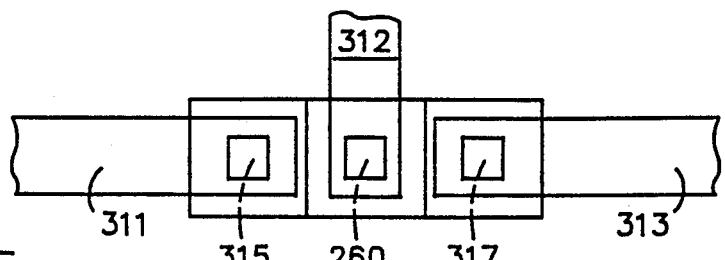
Figure 26:
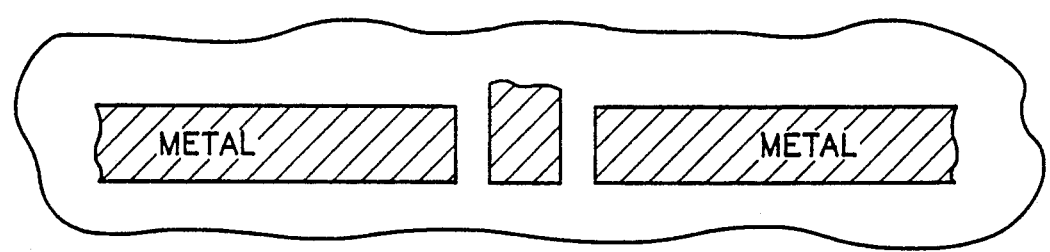
Figure 27:
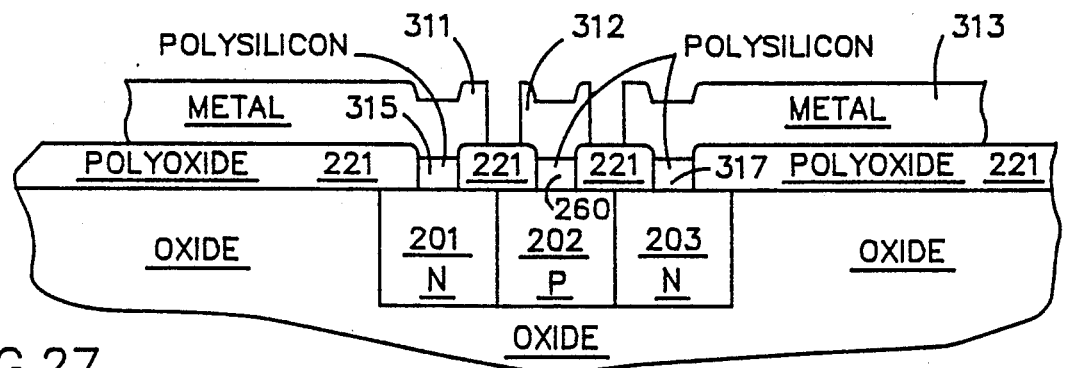
Figure 28:
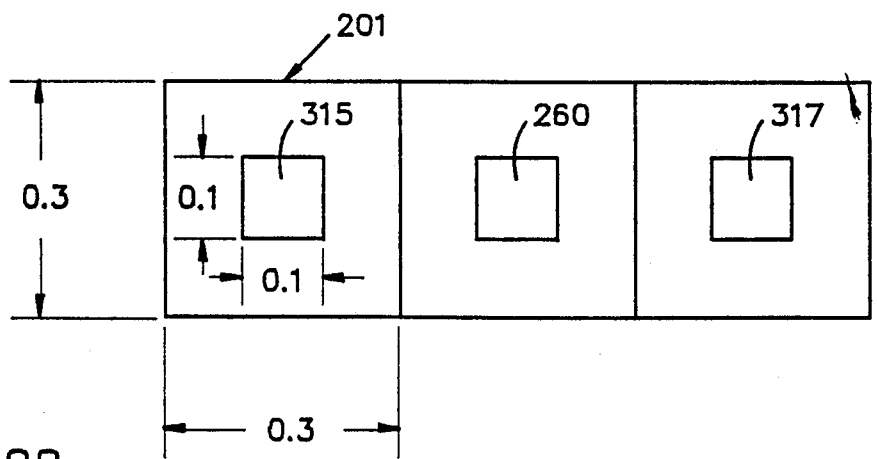

FIG. 13 is a view in top plan of a bipolar device of the type of FIG. 8 without the oxide overlay;

FIG. 14 shows the device of FIG. 13 in cross-section in field oxide;

FIG. 15 shows the application of a polysilicon layer covered by a nitride layer to the structure of FIG. 14;

FIG. 16 shows a contact mask;

FIG. 17 shows the nitride buttons remaining over each of the bipolar elements atop the polysilicon layer;

FIG. 18 shows the etching away of approximately ½ of the polysilicon layer prior to oxidation;

FIG. 19 shows the polysilicon layer converted to polyoxide except where the nitride buttons preserved the polysilicon;

FIG. 20 shows the mask for opening regions to the base electrode polysilicon;

FIG. 21 shows the boron implant to achieve the doping of the polysilicon electrode;

FIG. 22 shows a mask for opening regions to the collector and emitter (N regions);

FIG. 23 shows these regions opened and the polysilicon therein being doped by phosphorus implant;

FIG. 24 shows the nitride buttons removed and the layer of metal over top of the structure;

FIG. 25 shows the arrangement in top plan view as delineated by the mask of FIG. 26;

FIG. 27 shows the completed device following sintering; and,

FIG. 28 shows dimensions achievable in the contact region for these devices, the elements, such as the collector 201 measuring 0.3 by 0.3 microns and the contact regions, such as 315 measuring 0.1 by 0.1 microns.

Figure 29:
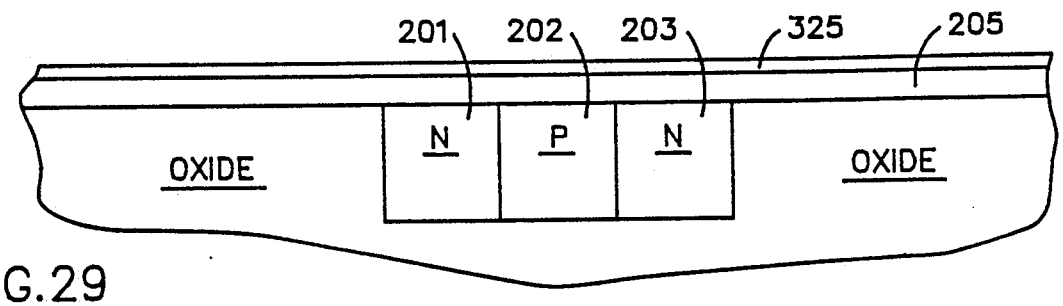
Figure 30:
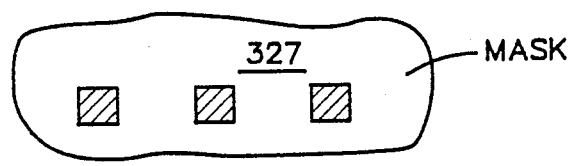
Figure 31:
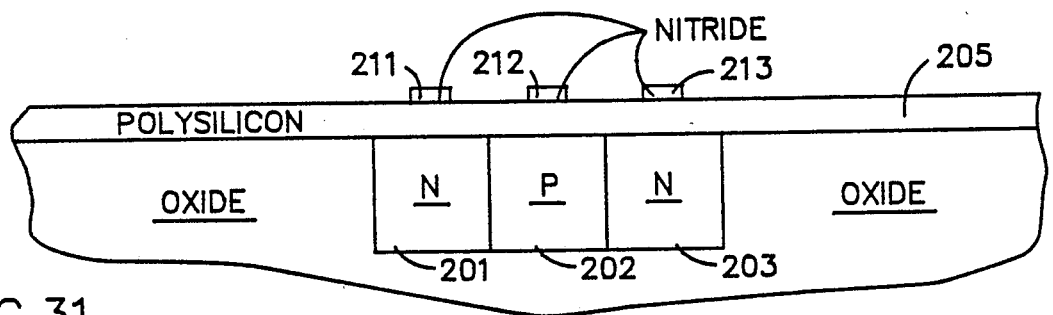
Figure 32:
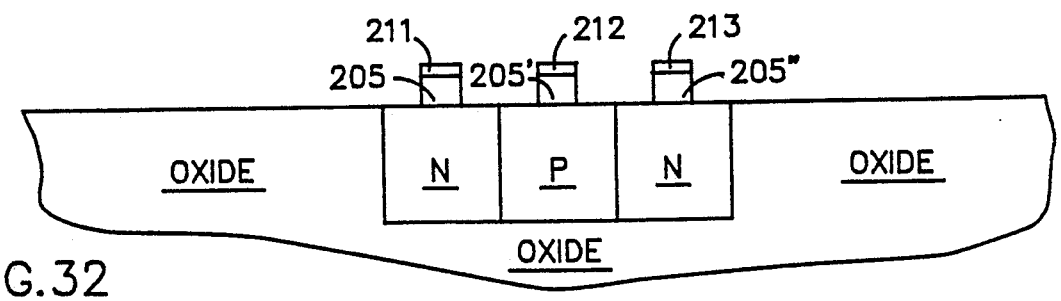
Figure 33:
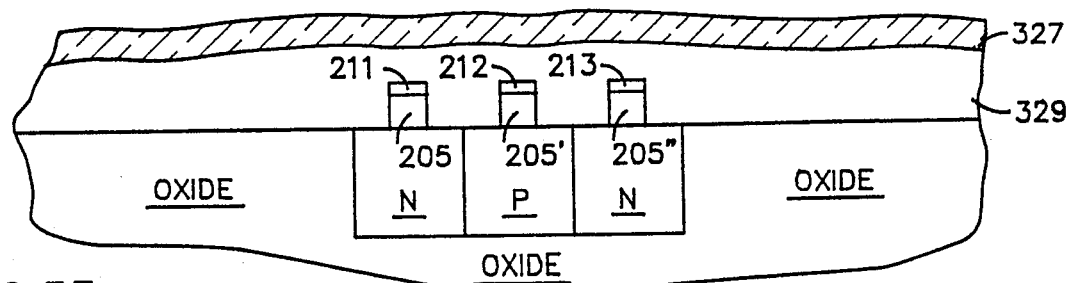
Figure 34:
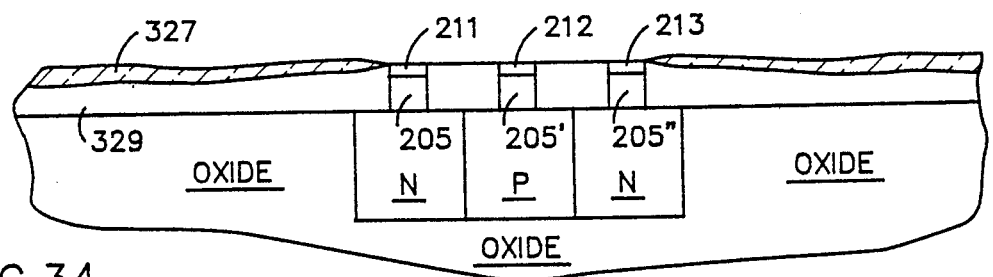
Figure 35:
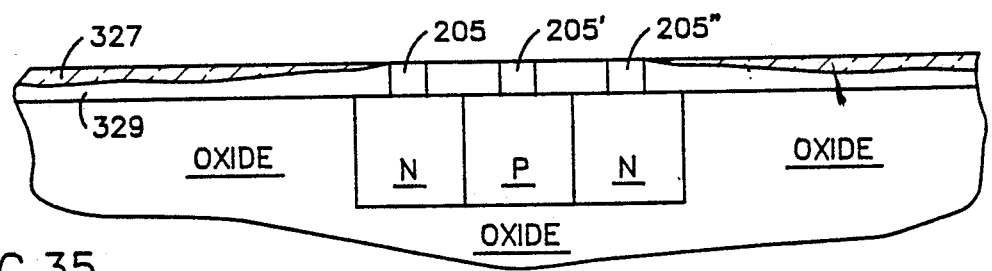
Figure 36:
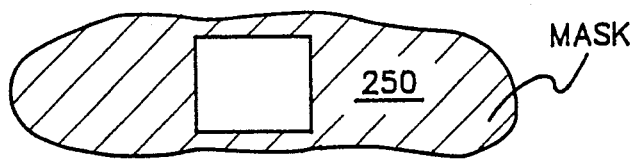
Figure 37:
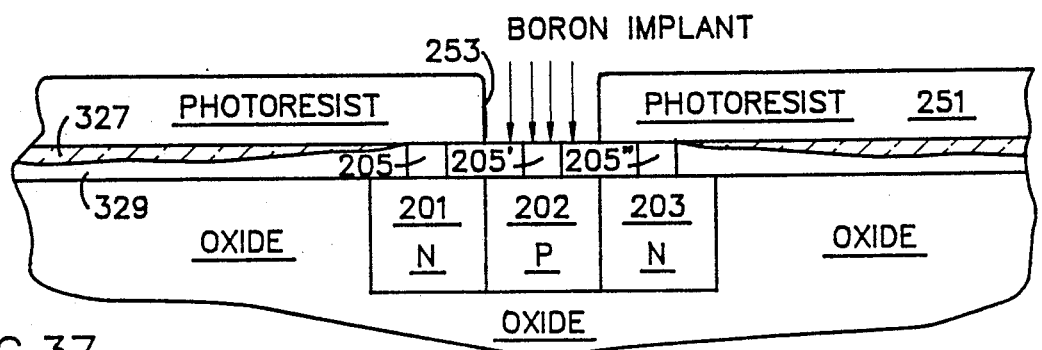
Figure 37A:
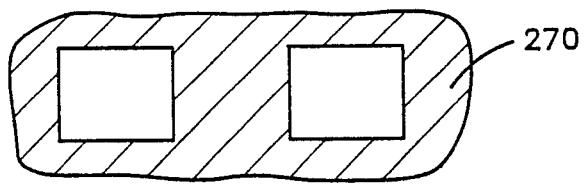
Figure 38:
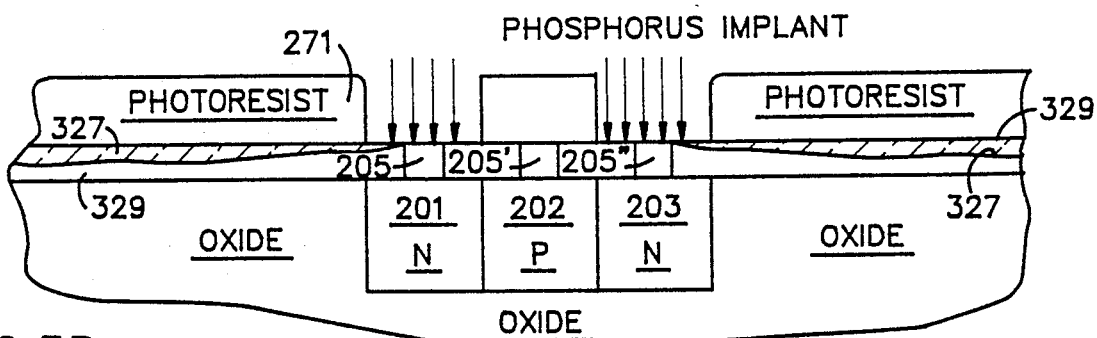
Figure 39:
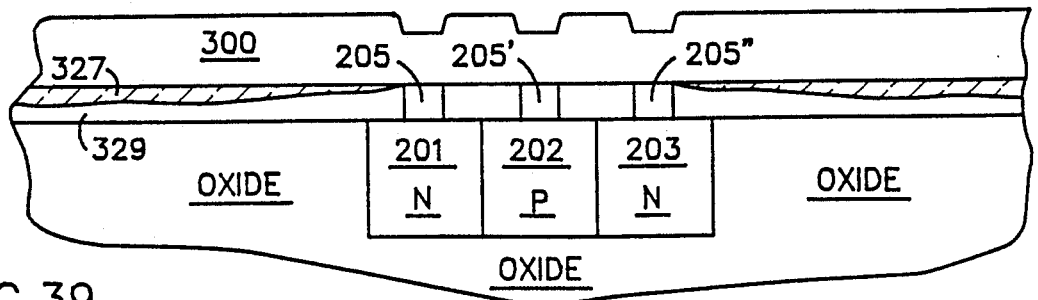
Figure 40:
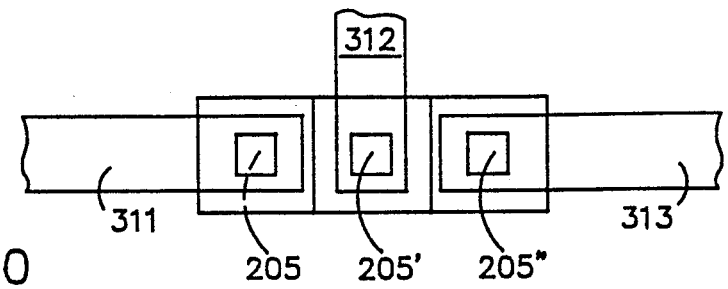
Figure 41:
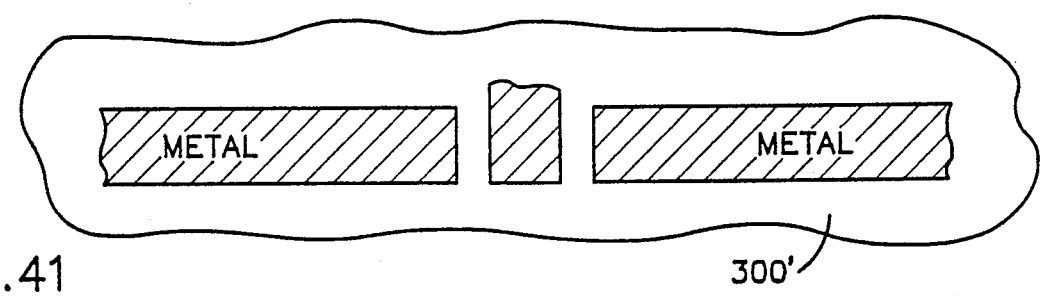
Figure 42:
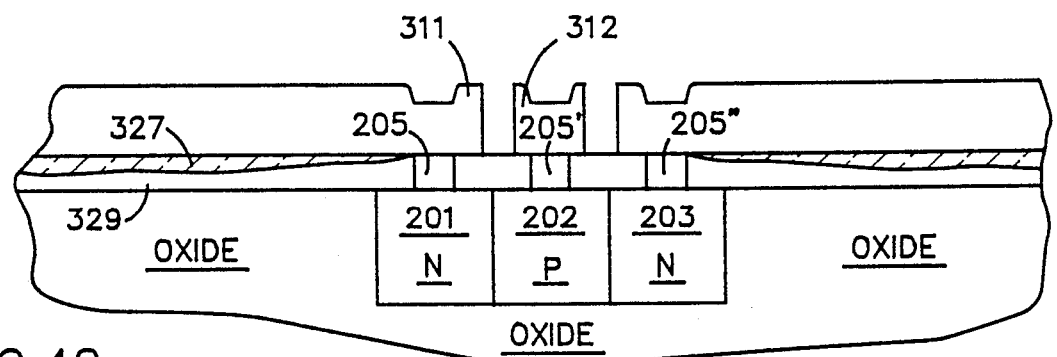
Figure 43:
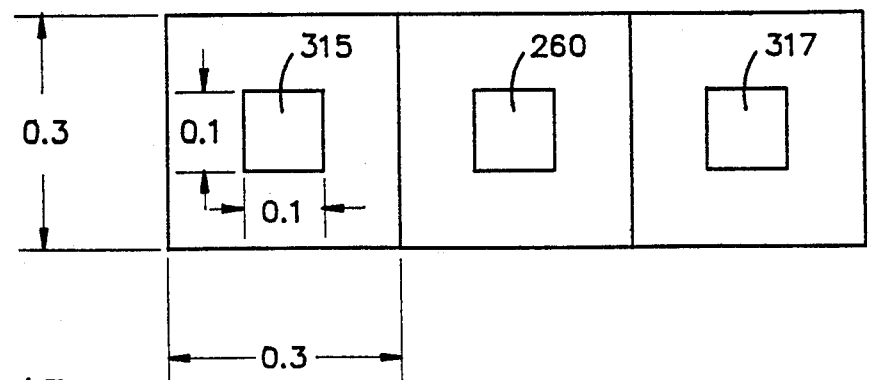

FIGS. 29-43 disclose yet another alternative method for forming the contacts;

FIG. 29 shows the NPN elements of a transistor being formed embedded in oxide and covered by a layer of polysilicon, in turn covered by a layer of nitride;

FIG. 30 is a contact mask;

FIG. 31 shows the nitride contact buttons;

FIG. 32 depicts the isolated polysilicon contacts;

FIG. 33 reveals the plasma oxide covering the contacts, and in turn covered by glass (SOG);

FIG. 34 planarizes the structure of FIG. 33 down to the tops of the nitride buttons;

FIG. 35 shows the structure of FIG. 34 with the nitride buttons removed;

FIG. 36 shows the mask to be used in making a doping opening to the base contact;

FIG. 37 shows the doping step for the base contact;

FIG. 37A shows a mask for making openings to the collector and emitter contacts;

FIG. 38 shows the doping step for the collector and emitter contacts;

FIG. 39 includes the metal interconnect layer;

FIG. 40 shows the delineated metal interconnects;

FIG. 41 shows the mask for effecting the delineation;

FIG. 42 shows the completed device; and,

FIG. 43 is an example of relative sizes available from this method.

BRIEF DESCRIPTION OF A PREFERRED EMBODIMENT OF THE INVENTION

In the device produced in accordance with the present invention, the effects of the substrate are minimized relative to the operation of the device. It should be realized that the isolated active region may be completely contained within a surface area of approximately $6d \times 3d = 18d^2$ wherein d is only 0.4 micrometers. The active region is completely separated from the substrate by substrate oxidation and the parasitic capacitances and resistances are almost completely reduced to a minimum value attainable because the transistor is reduced to just its electronically active region. In the conventional (vertical) transistor, in the electrically active region, is only a very small fraction of the total transistor area or volume. The dielectric isolation between transistors offered by the substrate oxidation has advantages with respect to high frequency performance, high voltage integrated circuits, radiation resistance, and circuit flexibility, i.e., the process can provide NPN, PNP, JFET, MOSFET, etc. devices on the same integrated circuit chip.

The principles of the invention apply equally to NPN or PNP type transistors wherein the base may be ungraded or graded P+P or N+N and it may incorporate a base region potential barrier that will deflect the electrons in transit across the base region away from the base metallization contact. This also reduces the base region contact resistance. Also, a doped skin may be formed around the active portion of the device to keep the electrons away from the base periphery and urged toward the central part of the base region. This aids in reducing surface recombination and thus increases gain, especially for operation at very low current levels.

Figure 1:
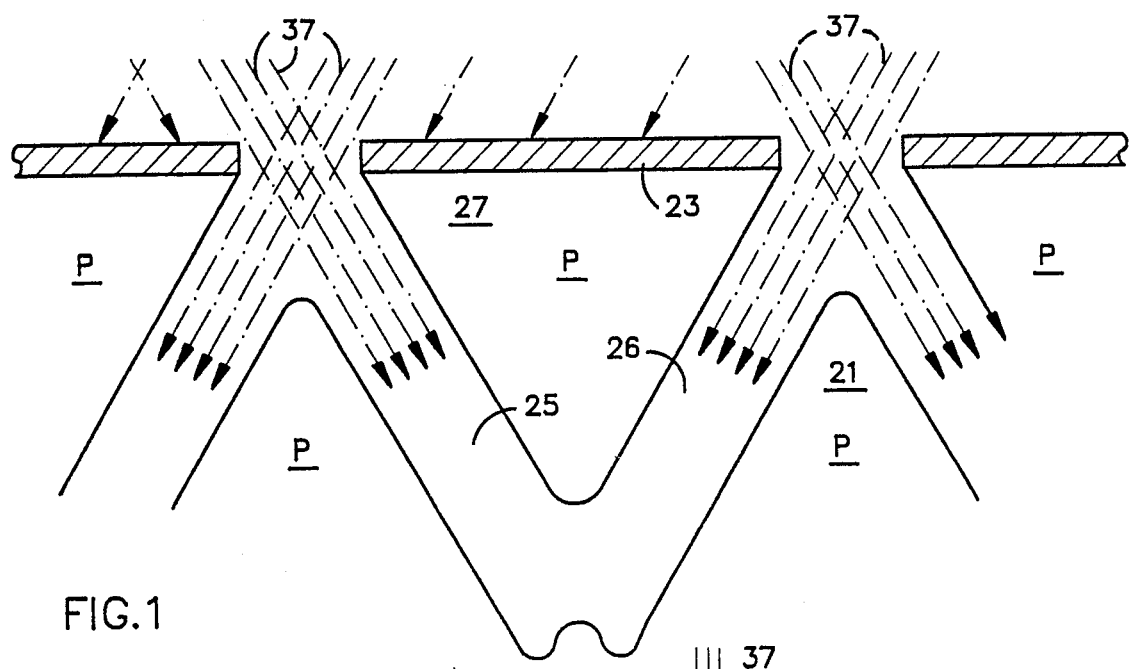
FIG. 1 is a cross sectional view through the substrate showing the formation of intersecting slots.

Referring now to FIG. 1, substrate 21 is masked by photoresist 23 which is patterned to define the penetration regions for intercepting slots 25 and 26. Since substrate 21 is shown doped P type, the intermediate region 27 which will eventually comprise a plurality of transistors, is also of the P type, having been carved from the substrate by the slots 25 and 26. To prevent intermediate region 27, better defined as a semi-array of transistor regions, from falling into substrate 21, it should be noted that the slots 25 and 26 are interrupted to leave shoulders at spaced apart intervals therealong, best seen at 31, 31', 32, 32' and 33, 33' in FIG. 4.

Since the preferred way of forming slots 25 and 2o is by ion milling, shown by the flux lines 37 in FIG. 1, the photoresist masking layer 23 is a material with a low sputtering rate such as one of the heavier metals.

Figure 2:
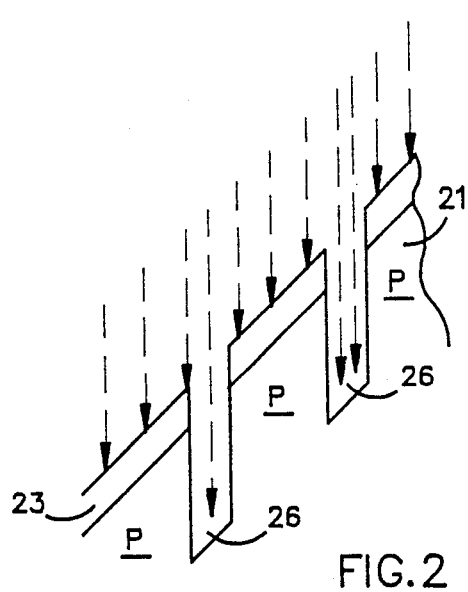
FIG. 2 shows a substrate oriented at an angle above the horizontal such that vertical milling may form the diagonally penetrating slots.
Figure 3:
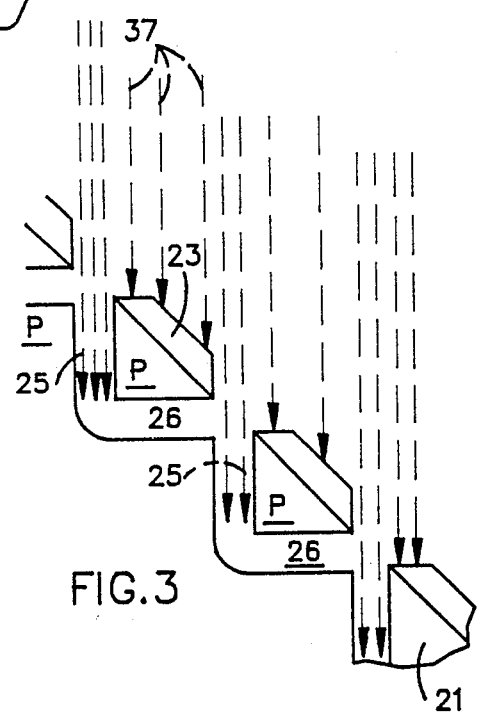
FIG. 3 shows the substrate oppositely oriented to that of FIG. 2 such that vertical milling may again form the other portion of the intersecting slots.

FIGS. 2 and 3 illustrate the ease of forming intercepting slots such as 25 and 26 simply by orienting the substrate at angles, e.g., 60° to the horizontal, such that the ion flux 37 may remain in its vertical pattern to form first slots 26 and thereafter slots 25 simply by rotating the substrate 21 by 90°.

While the triangular array 27 is shown as being substantially equilateral, it need not be and the angles may be varied to configure the active regions as desired for specific purposes. It will also be noticed from FIGS. 2 and 3 that slots 25 and 26 terminate where they intercept because extending them deeper into the substrate would serve no purpose.

Figure 4:
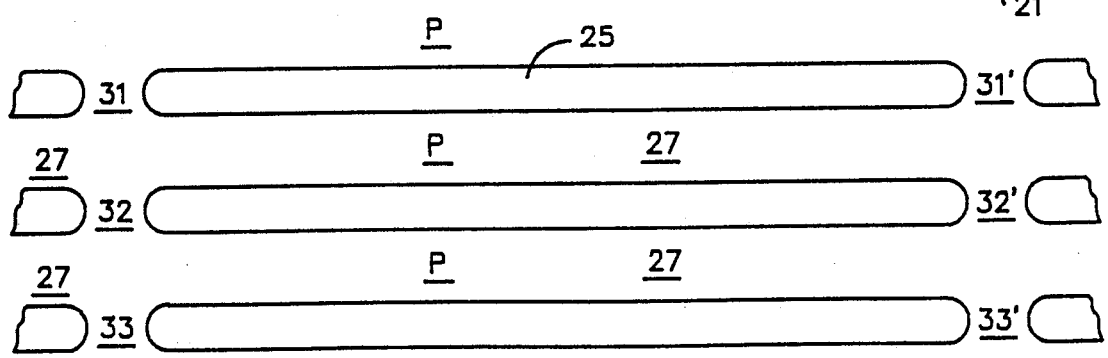
FIG. 4 is a view in top plan of the substrate showing the spaced apart intersecting slots with support regions between the ends thereof.

From FIG. 4 it may be seen that the slots 25 and 26 may be intermittent such that supporting ribs or webs 31, 32, 33 and 31', 32' and 33' serve to support each semi-array 27. These webs or supports may be at spaced apart locations along the slots 25 and 26 or merely comprise only supports at the edges of the chips because they serve but a temporary purpose as the slots will be filled with substrate oxide to provide the permanent support for each transistor region.

Figure 5:
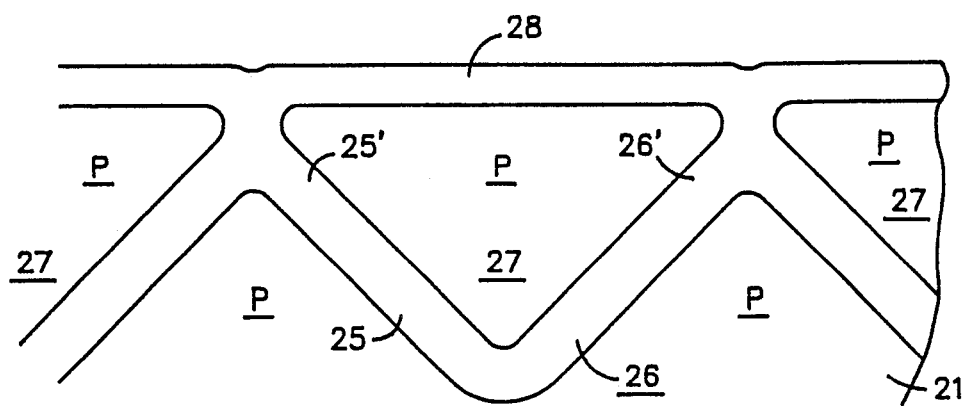
FIG. 5 is a front view of the triangular semi-arrays of substrate formed by the intersecting slots and separated from the substrate proper.

1 The oxidation step is shown in FIG. 5 wherein silicon oxide 25' and 26' fill the respective slots 25 and 26. Also, an upper layer of silicon oxide 28 covers the upper surface and is contiguous with the silicon oxide 25' and 26' such that semi-array 27 is totally isolated from the substrate 21 by the silicon oxide and the periphery of the semi-arrays 27 are substantially covered by the oxide.

Figure 6:
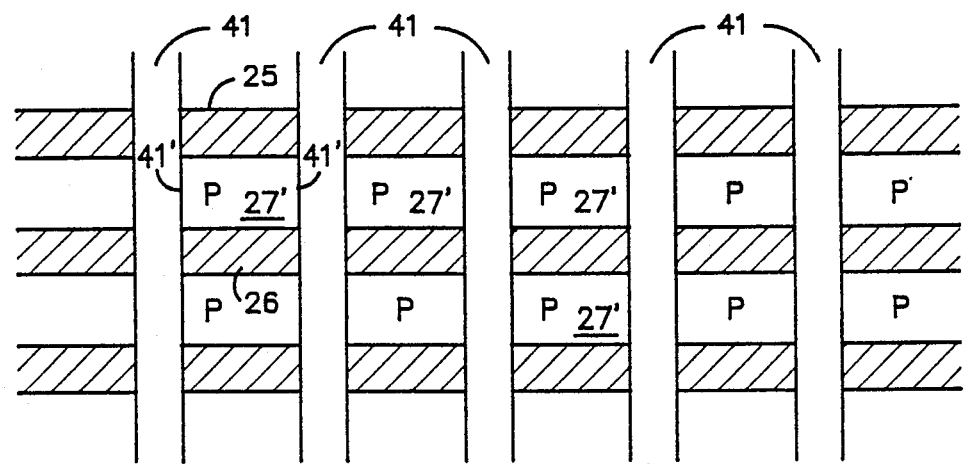
FIG. 6 is the introduction of orthogonal slots relative to the pairs of intersecting slots.
Figure 7:
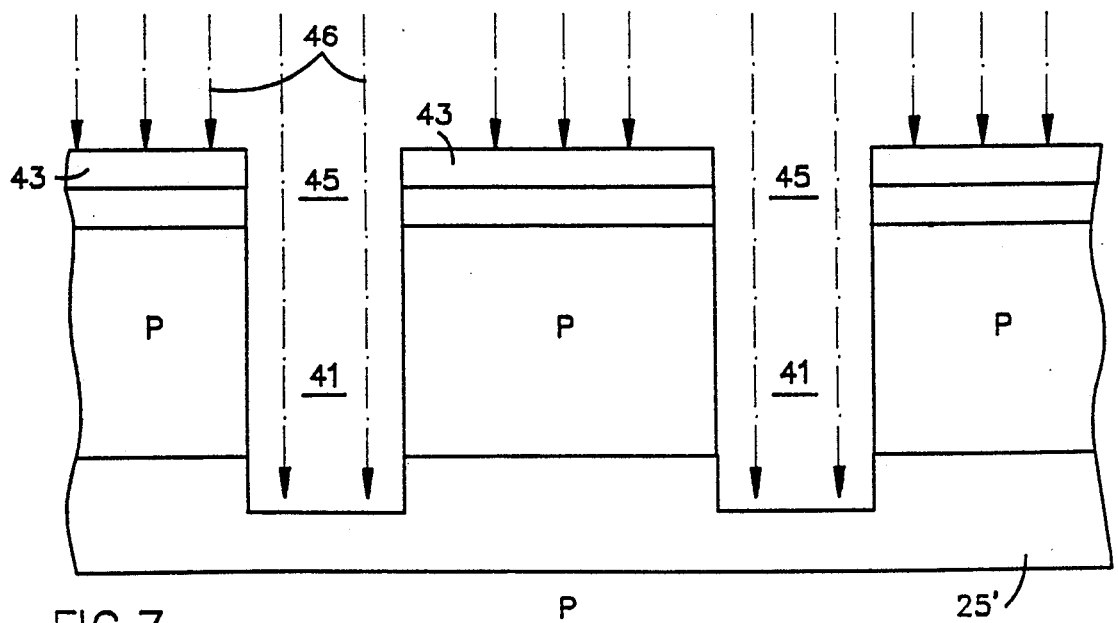
FIG. 7 shows the formation of the orthogonal slots via milling.

In FIG. 6, orthogonal slots 41 divide the semi-arrays 27 into the individual transistor regions 27' and provide ingress for the doping to follow. Thus, each orthogonal slot 41 includes sidewalls 41' through which individual transistor regions 27' will be doped. The other sidewalls of slots 41 provide for doping adjacent transistor regions 27'. Slots 41 may be ion milled using the masking technique heretofore employed. Consequently photoresist 43 of a heavier metal is patterned, as shown in FIG. 7 to provide for ion milling slots 41 via the openings 45 in the heavy photoresist 43 and silicon layer. The ion flux is illustrated by the lines 46.

In FIG. 8, an individual transistor region 27' is shown comprising the N+doped region 51, P doped region 52 and N+doped region 53. The P region 52 is the base region and comprises a portion of the original substrate 21. However, both N+regions 51 and 53 are provided by doping region 27' via the sidewalls 41' of orthogonal slots 41 (FIG. 6) with phosphorus deposition, diffusion or implantation plus drive-in to create the emitter region 51 and the collector region 53. Thereafter, the structure of FIG. 8 is oxidized to fill in slots 41 with silicon oxide 54 and covering layer 55.

A slight variation of the structure of FIG. 8 is indicated by the dotted line 60 wherein the P region 52 may comprise a P+ region 61 and a P region 52 simply by providing a boron doping via the right hand sidewall 41' (left slot 54) prior to the phosphorus doping and then driving in the P+ region 61 such that the base will now comprise a graded PP+region 52, 61.

Figure 9:
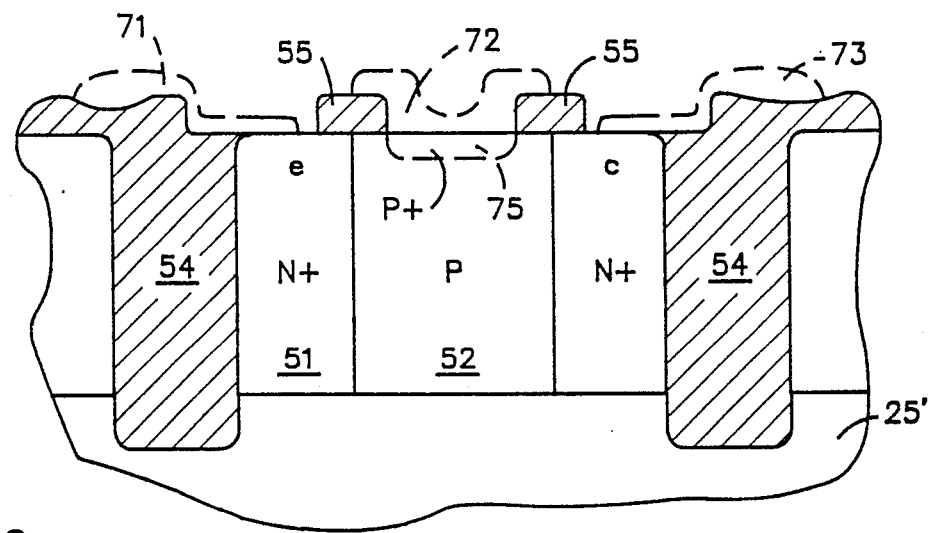
FIG. 9 is a view of the structure of FIG. 8 with metallization contacts for the emitter, base and collector regions.

The next step in the process is illustrated in FIG. 9 wherein the silicon oxide layer 51 has been patterned and metallization applied to comprise the emitter electrode 71, base electrode 72 and collector electrode 73. However, prior to applying the metallization, a light boron deposit has been made in the base region 52 to provide the P+base spanning region 75.

The purpose of the boron deposition 75, prior to the metallization, is twofold, i.e., first to reduce the base region contact resistance and second to produce a potential barrier $P+$ that will deflect the electrons in transit across the base region 52 away from the base contact.

Figure 10:
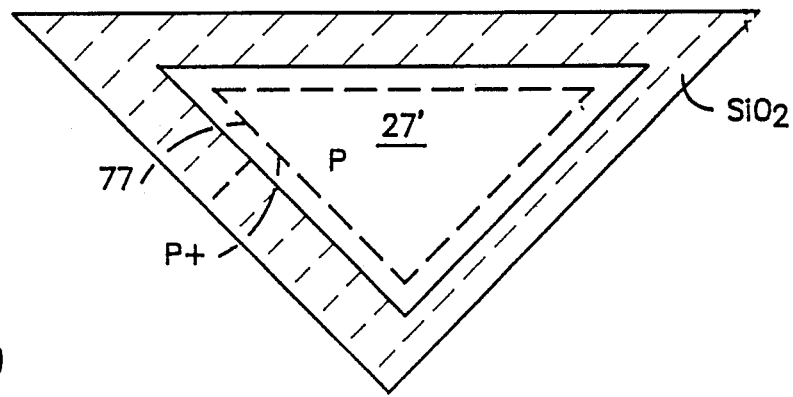
FIG. 10 shows a P+skin applied to the periphery of a P-doped transistor.

In FIG. 10 another innovation is shown in the form of the P+skin 77 about the periphery of the individual transistor active region 27'. The P+skin is formed by a light boron deposition for the purpose of keeping the electrons away from the base periphery and urging them toward the central part of the base region 52. This reduces surface recombination and thus, increases gain, especially for operation at currents in the nanoampere range.

Figure 11:
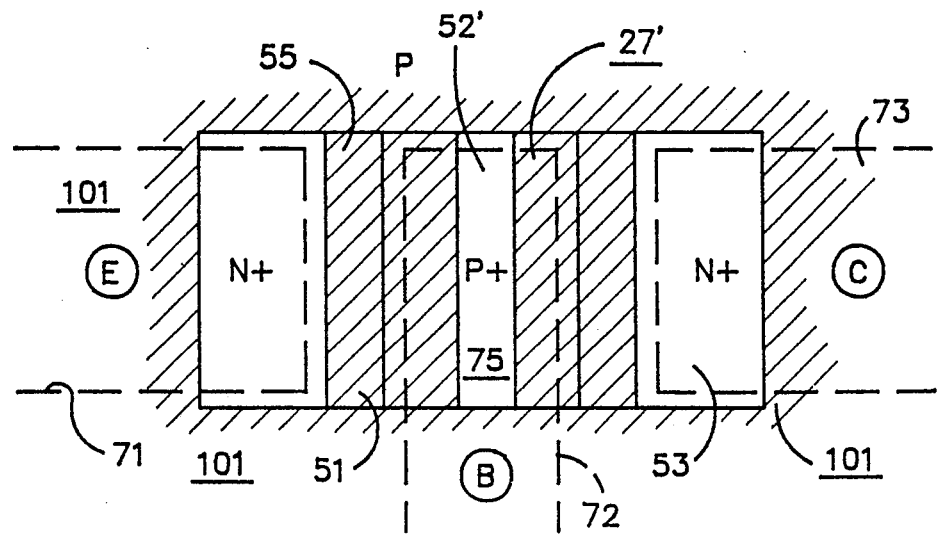
FIG. 11 is a top plan view showing the electrode connections.

FIG. 11 shows a completed transistor in accordance with the general principles of the invention wherein the active region 27' is shown totally surrounded by the silicon oxide 101 and the electrodes 71, 72 and 73 for the emitter region 51, base region 52 and collector 53 are seen in top plan view. Also, the P+base spanning region 75 is seen in plan across base region 52.

As previously mentioned, the transistor is reduced to just its electronically active area.

By using an angled boron implantation prior to the phosphorus deposition of FIG. 8, the drift field P+, P in the base region 52 was produced, such as is found in conventional double diffused devices.

Figure 12:
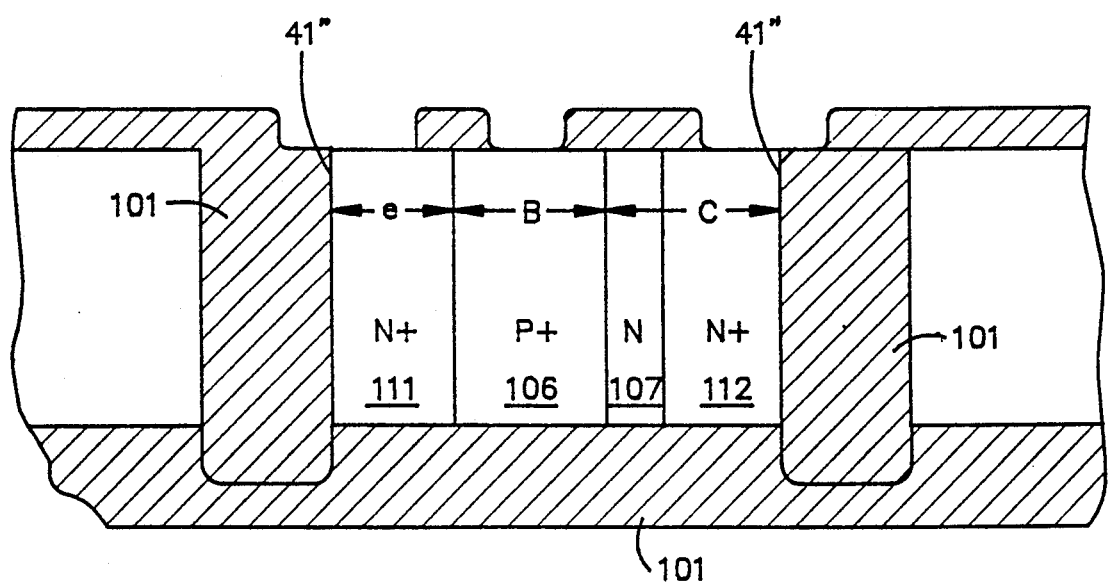
FIG. 12 shows a transistor produced starting with an N doped substrate and ending with a NPN transistor or if a boron doping step is included, an N+P+N N+transistor.

Finally, an NPN device can be built utilizing an N-type substrate in the manner of having built the PNP device starting from a P substrate, as described. This is shown in FIG. 12 wherein all doping is accomplished through the sidewalls 41" of the orthogonal slots, as previously explained. First the P+region 106 is formed via angled implanting through the left hand sidewall 41',' of boron material, followed by heating to drive in region 106 to its position shown in FIG. 12 adjacent an original portion 107 of the N substrate.

Next, phosphorus doping is carried out through both sidewalls 41" to form the emitter region 111 doped N+and the remaining portion of the collector region doped N+and shown at 112, which taken together with region 107 comprises the graded collector.

Patterning of the silicon oxide on the top of this device has been shown and it is only necessary to lay down the metallization pattern for electrical connection to the various transistor regions.

Thus, a lateral, dielectrically isolated NPN transistor with a drift field in the base and an NN+collector region has been formed with all the characteristics heretofore attributed to these sub-micron devices.

The principles of the present invention are compatible with use of the Perkin Elmer Projection Printer equipment for 2 micron dimensions, the 10:1 stepper for 1 micron rated dimensions, and electron beam or X-ray lithography for under 1 micron dimensions.

An alternative method for forming contacts, particularly to very small dimensions, is set forth in FIGS. 13–28.

In FIG. 13, the collector, base and emitter 201, 202 and 203 are depicted in a lateral arrangement, as seen in top plan. Doping of these elements has been accomplished as described through FIG. 9.

In FIG. 14, the collector 201 is shown as being N doped, the base 202 is P doped and the emitter 203 is N doped, all surrounded by oxide.

The first step in building sub-micron contacts (i.e., 0.1 to 0.25 micron by 0.1 to 0.25 micron) for these devices is to deposit undoped polysilicon to approximately 5000 angstroms or less for such diminutive contacts. This step may be applied to the structure of FIG. 9, once the upper layer is removed. The contact doping steps of FIGS. 21 and 23 would, of course, be switched for a PNP device.

Returning to FIG. 15, a layer 206 of nitride is deposited to a thickness of approximately 1000 angstroms over layer 205.

The mask 207 of FIG. 16 is employed with photoresist 208 to delineate the nitride 206, thereby leaving the nitride buttons 211, 212 and 213 over the collector 201, base 202 and emitter 203 respectively (FIG. 17).

To insure ultimate planarization, a portion of the polysilicon is etch removed (FIG. 18). This may comprise 2500 angstroms of polysilicon. A non-selective or anisotropic etch is employed so that only the polysilicon is removed.

Next, the resist 208, 208' and 208" is stripped and the polysilicon is then oxidize-.d to become polyoxioe 221, shown in FIG. 19. The nitride buttons 211, 212 and 213 are removed using a selective or wet etch conventional step. The polyoxide 221 also fills in the spaces between the contacts 315, 260 and 317 and rises slightly above the contacts to insulate them.

FIG. 19 shows the structure after the nitride buttons 211, 212 and 213 have been removed.

In FIG. 20, mask 250 is used, together with photoresist 251, to open aperture 253 to the P doped base 202, (FIG. 20) for boron implanting into the base electrode 260 to insure contact to base 202. Implanting is carried out using a 60 Kev implanter with a 1 to $5 \times 10^{15}$ ions per cm$^2$ dose Next, the photoresist 251 is stripped and a new layer 271 applied for use with the mask 270 (FIG. 22) to open the new layer of photoresist 271 above the collector 201, and emitter 203. The phosphorus ions are implanted, the photoresist 271 is stripped and the device of FIG. 23 is annealed for the implants at 800° C. for 40 minutes in a nitrogen atmosphere.

In FIG. 24, a metal layer 300 has been applied over the structure polyoxide 221 and other structure and the metal mask of FIG. 26 is applied, and the metal is etched to provide a metal interconnect 311 (FIG. 25) to the doped poly electrode 315 of collector 201, interconnect 312 to the doped poly electrode 260 of base 202 and interconnect 313 to the doped poly electrode 317 of emitter 203.

FIG. 27 shows a completed device.

FIG. 28 shows relative sizes for the bipolar device, the elements themselves, such as the collector, measuring 0.3 by 0.3 microns and the contact regions, measuring 0.1 by 0.1 microns.

Yet another alternative method for forming the contacts is disclosed, beginning with FIG. 29 wherein the three elements collector 201, base 202 and emitter 203 are first covered by polysilicon 205 to a depth of, e.g., approximately 3000 angstroms, and nitride 325 is deposited to a depth of, e.g., approximately 1000 angstroms. Mask 327 serves to form the nitride buttons 211, 212 and 213 (the same as before). These nitride buttons 211-213 are preferably centered over the collector 201, base 202 and emitter 203 as seen in FIG. 31, although considerable leeway is available for any misalignment, as is apparent from FIG. 43.

In FIG. 32, the unprotected polysilicon 205 is removed in conventional manner, such as by etching to leave undoped polysilicon contacts 205, 205', and 205".

In FIG. 33, plasma oxide 329 is deposited using the conventional planarization process to a depth of approximately 3000 angstroms. This step is followed by spinning on glass 327 (SOG) so as to look substantially planar.

In FIG. 34, a reactive ion etching (RIE) conventional step is carried out for effecting planarization which exposes the nitride buttons 211, 212 and 213 and is terminated approximately at the level of the tops of these buttons.

In FIG. 35, the nitride buttons 211, 212 and 213 have been removed from the contacts 205, 205' and 205" using a conventional step to prepare the contacts for doping to make them properly conductive.

In FIG. 36, mask 250 is shown for delineating photoresist 251, in the previous manner, to provide the opening 253 for the boron implant, as shown by the arrows in FIG. 37.

In similar fashion, mask 270 of FIG. 37A, is again utilized to delineate the photoresist 271 for the phosphorus implants, shown by the arrows (FIG. 38), thereby concluding the doping of the three polysilicon contacts 205, 205' and 205" in the same N or P doping as their underlying collector, base and emitter.

In FIG. 39, the metal layer 300 has been applied over this structure, and the metal mask of FIG. 41, shown at 300', is used and the metal is etched to provide the metal interconnects 311 (FIG. 40) to the doped poly electrode 205 of collector 201, interconnect 312 to the doped poly electrode 205' of the base 202 and interconnect 313 to the doped poly electrode 205" of emitter 203.

FIG. 42 shows the completed device made in this fashion.

Finally, FIG. 43 shows, by way of example, relative sizes for the bipolar device, the elements themselves such as the collector measuring 0.3 by 0.3 microns and the contact regions measuring 0.1 by 0.1 microns.

The use of an E-beam fabricator, guided by the masks successively used herein, makes the VLSI contacts of the order of these dimensions. Of course, larger contacts might be readily utilized. This technique is accomplished through the use of polysilicon which remains in the electrode areas, but is converted to polyoxide in the remaining areas with the nitride buttons having guarded against oxidation of the polysilicon electrode areas.

If desired, single MOS or bipolar devices may be made, and it is only necessary to insulate them by isolation, usually in lieu of the field oxide, illustrated.

This method is also applicable to MOS, GaAs and conventional bipolar minimal size contacts obtained down to 0.1 X 0.1 microns, or to 0.1 micron diameter where the spot size is 0.1 micron, or up to 1 micron sizes or larger.

In summary, the following advantages are achieved by this invention:

1. Sub-micron contact technology.
2. Contact integrity without the need of excessive silicon content in the metal or contact barriers such as Titanium Nitride, etc.
3. Planar structures without severe steps to hinder metal step coverage, or restrictions for proximity of contact to vias to gates, thereby improving packing density.
4. Principle applicable to MOS (NMOS, PMOS, CMOS, etc.), Bipolar devices and GaAs technologies.
5. Contact technology compatible with shallow junctions and other state of the art processes such as selective silicides.
6. Minimum overlap of metal for interconnects.
7. Via overlap of contact realizable with this technique.

What is claimed is:

1. An array of VLSI dimensioned NPN type lateral transistors formed in a silicon substrate doped P-type, each transistor comprising in combination:
   a plurality of first sidewalls of pairs of slots in spaced apart relation across the substrate defining semi-arrays of v shaped intermediate regions which regions will become transistors;
   silicon oxide filling said slots and covering the surface of the substrate through which they were made;
   a plurality of second sidewalls of orthogonal slots relative to said pairs of slots dividing the semi-arrays of regions into individual transistor active regions;
   N+ doping introduced into each of said active regions via said second sidewalls and driven in to comprise an emitter region and a collector region on respective sides of original P substrate comprising the base region for each active region;
   an electrical contact of the order of 0.1 microns across in electrical connection with the respective emitter, base and collector regions of each active region; and,
   silicon oxide at least substantially covering the periphery of each active region.

2. A transistor array in accordance with claim 1, wherein:
   each transistor further comprises a P+ doped region extending into and across the top of the base region within the substrate to reduce base region contact resistance and to provide an electron deflecting potential barrier.

3. A transistor array in accordance with claim 1 or 2, wherein:
   each transistor further comprises a P+ doped skin to force electrons toward the center of its base region.

4. An array of VLSI dimensioned PNP type lateral transistors formed in a silicon substrate doped N-type, each comprising in combination:
   a plurality of first sidewalls of pairs of slots in spaced apart relation across the substrate defining semi-arrays of V shaped intermediate regions which will become transistors;
   silicon oxide filling said slots and covering the surface of the substrate through which they were made;
   a plurality of second sidewalls of orthogonal slots relative to said pairs of slots dividing the semi-arrays of regions into individual transistor active regions;
   P+ doping introduced into each of said active regions via said second sidewalls and driven in to comprise an emitter region and a collector region on respective sides of original N substrate comprising a base region;
   an electrical contact in electrical connection with the respective emitter, base and collector regions; and,
   silicon oxide at least substantially covering the periphery of each active region; and,
   each transistor measuring, of the order of, 2.4 microns by 1.2 microns.

5. A transistor array in accordance with claim 4, wherein:
   each transistor further comprises a N+ doped region extending into and across the top of the base region underneath the metallization to reduce base region contact resistance and to provide an electron deflecting potential barrier.

6. A transistor array in accordance with claims 4 or 5, wherein:

each transistor further comprises a N+ doped skin to force electrons toward the center of its base region.

7. An array of VLSI dimensioned lateral transistors formed in a silicon substrate doped P or N type, each comprising in combination:
   a plurality of first sidewalls of pairs of intersecting slots in spaced apart relation across the substrate defining semi-arrays of V shaped intermediate regions which will become transistors;
   silicon oxide filling said slots and covering the surface of the substrate through which they were made;
   a plurality of second sidewalls of orthogonal slots relative to said pairs of slots dividing the semi-arrays of regions into individual transistor active regions;
   doping of one of N and P introduced into each of said active regions via said second sidewalls and driven in to comprise an emitter region and a collector region on respective sides of original substrate comprising the base region;
   an electrical contact of the order of 0.1 microns across in electrical connection with the respective emitter region, base region and collector region;
   silicon oxide at least substantially covering the periphery of each active region; and,
   each transistor measuring, of the order of, 2.4 microns by 1.2 microns in area.

8. A transistor array in accordance with claim 7, wherein:
   each transistor further comprises a doped region of one of P and N extending into and across the top of the base region underneath the metallization to reduce base region contact resistance and to provide an electron deflecting potential barrier.

9. A transistor array in accordance with claim 8, wherein:
   each transistor further comprises doped skin of one of P and N to force electrons toward the centro of its base region.

* * * * *